US012709699B2

(12) United States Patent
Iikura et al.

(10) Patent No.: US 12,709,699 B2
(45) Date of Patent: Aug. 18, 2026

(54) POLISHING LIQUID AND POLISHING METHOD

(71) Applicant: Showa Denko Materials Co., Ltd., Tokyo (JP)

(72) Inventors: Daisuke Iikura, Tokyo (JP); Masako Aoki, Tokyo (JP)

(73) Assignee: Resonac Corporation, Tokyo (JP)

( * ) Notice: Subject to any disclaimer, the term of this patent is extended or adjusted under 35 U.S.C. 154(b) by 300 days.

(21) Appl. No.: 17/918,193

(22) PCT Filed: Nov. 11, 2020

(86) PCT No.: PCT/JP2020/042107

§ 371 (c)(1),
(2) Date: Oct. 11, 2022

(87) PCT Pub. No.: WO2022/102019

PCT Pub. Date: May 19, 2022

(65) Prior Publication Data

US 2023/0145080 A1 May 11, 2023

(51) Int. Cl.
*C09G 1/02* (2006.01)
*H10P 52/40* (2026.01)

(52) U.S. Cl.
CPC .............. *C09G 1/02* (2013.01); *H10P 52/403* (2026.01)

(58) Field of Classification Search
CPC . C09G 1/02; H01L 21/3212; H01L 21/31053; H01L 21/02164; H01L 21/0217; H01L 21/30625; B24B 37/00; C09K 3/14; C09K 3/1409; C09K 3/1454
See application file for complete search history.

(56) References Cited

U.S. PATENT DOCUMENTS 8,728,341 B2 * 5/2014 Ryuzaki .................... B24B 1/00 438/692
2012/0299158 A1 * 11/2012 Shinoda ............... C09K 3/1472 438/693
2013/0143397 A1 * 6/2013 Fuller ................ H10D 84/0135 438/587
2013/0244432 A1 * 9/2013 Reiss .................. C09K 3/1463 438/693
2015/0024596 A1 * 1/2015 Minami ............ H01L 21/76224 438/693
2016/0319159 A1 * 11/2016 Minami ................ B24B 37/044
2018/0072917 A1 * 3/2018 Kobayashi ........ H01L 21/31053
2018/0258319 A1 * 9/2018 Akutsu .................... C09G 1/00
2019/0367777 A1 * 12/2019 Komatsu ............... B24B 37/044
2020/0032106 A1 * 1/2020 Iwano ...................... C09G 1/02
2020/0283659 A1 * 9/2020 Takahashi ................ C09G 1/02
2021/0017422 A1 * 1/2021 Iwano .................. C09K 3/1463
2021/0054233 A1 * 2/2021 Matsumoto .......... C09K 3/1436
2021/0071037 A1 * 3/2021 Iwano ...................... C09G 1/06

FOREIGN PATENT DOCUMENTS

CN 111868202 A 10/2020
JP H08-022970 A 1/1996
JP H10-106994 A 4/1998
JP 2006-249129 A 9/2006
JP 2010-141288 A 6/2010
JP 2012-084906 A 4/2012
JP 2019-153678 A 9/2019
KR 10-2016-0054466 A 5/2016
TW 201116614 A 5/2011
TW 201938747 A 10/2019
TW 201940652 A 10/2019
TW 202009286 A * 3/2020 ............... B24B 1/00
WO 02/067309 A1 8/2002
WO 2012/070541 A1 5/2012
WO 2012/070542 A1 5/2012
WO 2012/070544 A1 5/2012

OTHER PUBLICATIONS

TW-202009286-A, Machine Translation. (Year: 2025).*

* cited by examiner

*Primary Examiner* — Binh X Tran
*Assistant Examiner* — Christopher Remavege
(74) *Attorney, Agent, or Firm* — Fitch, Even, Tabin & Flannery LLP

(57) ABSTRACT

A polishing liquid containing: abrasive grains containing a hydroxide of a tetravalent metal element; a monovalent acid component having no carboxy group; and a non-ionic polymer, in which a pH is 4.5 or less. A polishing method including a step of polishing a surface to be polished by using this polishing liquid.

17 Claims, No Drawings

POLISHING LIQUID AND POLISHING METHOD

CROSS-REFERENCE TO RELATED APPLICATIONS

This application is a U.S. national phase application filed under 35 U.S.C. § 371 of International Application No. PCT/JP2020/042107, filed Nov. 11, 2020, designating the United States, which is incorporated herein by reference in its entirety.

TECHNICAL FIELD

The present disclosure relates to a polishing liquid, a polishing method, and the like.

BACKGROUND ART

In recent years, processing techniques for increasing density and miniaturization are becoming ever more important in manufacturing steps for semiconductor elements. CMP (chemical mechanical polishing) technique that is one of processing techniques has become an essential technique in manufacturing steps for semiconductor elements, for the formation of a shallow trench isolation (hereinafter, referred to as "STI"), flattening of pre-metal insulating materials or interlayer insulating materials, formation of plugs or embedded metal wirings, or the like.

As a polishing liquid most frequently used, for example, a silica-based polishing liquid containing silica (silicon oxide) particles such as fumed silica or colloidal silica as abrasive grains is exemplified. The silica-based polishing liquid is characterized by being high in general versatility, and can polish broad types of materials irrespective of insulating materials and conductive materials by appropriately selecting an abrasive grain content, a pH, an additive, or the like.

Meanwhile, as a polishing liquid mainly used for insulating materials such as silicon oxide, a demand for a polishing liquid containing cerium compound particles as abrasive grains is also increasing. For example, a cerium oxide-based polishing liquid containing cerium oxide particles as abrasive grains can polish silicon oxide at a high rate even when the abrasive grain content is lower than that in the silica-based polishing liquid (for example, see Patent Literatures 1 and 2 described below).

In recent years, in the manufacturing steps for semiconductor elements, it is required to achieve further micronization of wiring, and polishing scratches generated at the time of polishing are becoming problematic. That is, when polishing is performed using a conventional cerium oxide-based polishing liquid, even if minute polishing scratches are generated, there has been no problem as long as the sizes of the polishing scratches are smaller than conventional wiring widths; however, in a case where it is directed to achieve further micronization of the wiring, even minute polishing scratches become problematic.

With regard to this problem, an investigation has been conducted on polishing liquids that use particles of cerium hydroxide (for example, see Patent Literatures 3 to 5 described below). Furthermore, methods for producing particles of cerium hydroxide have also been investigated (for example, see Patent Literatures 6 and 7 described below).

CITATION LIST

Patent Literature

Patent Literature 1: Japanese Unexamined Patent Publication No. H10-106994

Patent Literature 2: Japanese Unexamined Patent Publication No. H08-022970

Patent Literature 3: International Publication WO 2002/067309

Patent Literature 4: International Publication WO 2012/070541

Patent Literature 5: International Publication WO 2012/070542

Patent Literature 6: Japanese Unexamined Patent Publication No. 2006-249129

Patent Literature 7: International Publication WO 2012/070544

SUMMARY OF INVENTION

Technical Problem

In semiconductor elements in recent years, miniaturization has been further accelerated, and thinning has progressed along with the reduction in wiring width. Along with this, in the CMP step or the like for formation of STI, it is necessary to polish the insulating member while suppressing excessive polishing of the stopper disposed on the convex portion of the substrate having a concavo-convex pattern. From such a viewpoint, it is required for the polishing liquid to obtain excellent polishing selectivity of an insulating material with respect to a stopper material (polishing rate ratio: the polishing rate for an insulating material/the polishing rate for a stopper material), and for example, it is required to obtain excellent polishing selectivity of silicon oxide with respect to silicon nitride (polishing rate ratio: the polishing rate for silicon oxide/the polishing rate of silicon nitride).

An object of an aspect of the present disclosure is to provide a polishing liquid capable of obtaining excellent polishing selectivity of silicon oxide with respect to silicon nitride. Furthermore, an object of another aspect of the present disclosure is to provide a polishing method using this polishing liquid.

Solution to Problem

An aspect of the present disclosure relates to a polishing liquid containing: abrasive grains containing a hydroxide of a tetravalent metal element; a monovalent acid component having no carboxy group; and a non-ionic polymer, in which a pH is 4.5 or less.

Another aspect of the present disclosure relates to a polishing method including a step of polishing a surface to be polished by using the aforementioned polishing liquid.

According to the polishing liquid and the polishing method described above, it is possible to selectively remove silicon oxide with respect to silicon nitride and to obtain excellent polishing selectivity of silicon oxide with respect to silicon nitride.

Advantageous Effects of Invention

According to an aspect of the present disclosure, it is possible to provide a polishing liquid capable of obtaining excellent polishing selectivity of silicon oxide with respect to silicon nitride. Furthermore, according to another aspect of the present disclosure, it is possible to provide a polishing method using this polishing liquid.

DESCRIPTION OF EMBODIMENTS

Hereinafter, an embodiment of the present disclosure will be described in detail.

Definition

In the present specification, the term "polishing liquid" is defined as a composition to be brought into contact with a surface to be polished, at the time of polishing. The term "polishing liquid" itself does not limit any components contained in the polishing liquid. As described later, a polishing liquid of the present embodiment can contain abrasive grains. The abrasive grains are also referred to as "polishing particles" (abrasive particle), but are referred to as "abrasive grains" in the present specification. The abrasive grains are generally solid particles, and it is considered that a subject to be removed is removed by a mechanical action of the abrasive grains and a chemical action of the abrasive grains (mainly, the surface of the abrasive grains) at the time of polishing, but the polishing mechanism is not limited thereto. "Polishing rate" means a rate at which the material is removed per unit time (Removal Rate).

A numerical range that has been indicated by use of "to" indicates the range that includes the numerical values which are described before and after "to", as the minimum value and the maximum value, respectively. "A or more" in the numerical range means A and a range of more than A. "A or less" in the numerical range means A and a range of less than A. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in the examples. Materials listed as examples in the present specification may be used singly or in combinations of two or more, unless otherwise specifically indicated. When a plurality of substances corresponding to each component exist in the composition, the content of each component in the composition means the total amount of the plurality of substances that exist in the composition, unless otherwise specified. "A or B" may include either one of A and B, and may also include both of A and B. The term "film" includes a structure having a shape which is formed on a part, in addition to a structure having a shape which is formed on the whole surface, when the film has been observed as a plan view. The term "step" includes not only an independent step but also a step by which an intended action of the step is achieved, though the step cannot be clearly distinguished from other steps.

<Polishing Liquid>

The polishing liquid of the present embodiment contains: abrasive grains containing a hydroxide of a tetravalent metal element; a monovalent acid component having no carboxy group (hereinafter, "acid component A" in some cases); and a non-ionic polymer, and a pH is 4.5 or less. The polishing liquid of the present embodiment can be used as a CMP polishing liquid. The polishing liquid of the present embodiment can be used in polishing of a surface to be polished (exposed surface) containing silicon oxide and silicon nitride and can be used for polishing a surface to be polished containing silicon oxide and silicon nitride so as to selectively remove silicon oxide with respect to silicon nitride.

According to the polishing liquid of the present embodiment, it is possible to selectively remove silicon oxide with respect to silicon nitride and to obtain excellent polishing selectivity of silicon oxide with respect to silicon nitride (polishing rate ratio: the polishing rate for silicon oxide/the polishing rate for silicon nitride). According to the polishing liquid of the present embodiment, it is possible to obtain a polishing rate ratio of 30 or more as the polishing rate ratio of silicon oxide with respect to silicon nitride.

The reason why the aforementioned effect is exhibited is not necessarily clear, but the present inventors speculate in the following way. That is, the abrasive grains containing a hydroxide of a tetravalent metal element tend to have a positive zeta potential; on the other hand, silicon oxide tends to have a negative zeta potential, and thus polishing of silicon oxide is promoted by the electrostatic attractive force between the abrasive grains and silicon oxide. On the other hand, in a case where the pH of the polishing liquid is 4.5 or less, silicon nitride tends to have a positive zeta potential, and thus polishing of silicon nitride is suppressed by electrostatic repulsion between the abrasive grains and silicon nitride. Further, in a case where the pH of the polishing liquid is 4.5 or less, the abrasive grains containing a hydroxide of a tetravalent metal element coexist the acid component A and the non-ionic polymer, and thus polishing of silicon oxide is promoted, and at the same time, polishing of silicon nitride is significantly suppressed. From the above reasons, according to the polishing liquid of the present embodiment, excellent polishing selectivity of silicon oxide with respect to silicon nitride can be obtained. However, the reason why the effect is expressed is not limited to this content.

The polishing rate ratio of silicon oxide with respect to silicon nitride is preferably 50 or more, more preferably 100 or more, further preferably 200 or more, particularly preferably 400 or more, extremely preferably 800 or more, highly preferably 1500 or more, and even more preferably 2000 or more. The polishing rate ratio of silicon oxide with respect to silicon nitride may be 5000 or less, 4000 or less, or 3000 or less.

(Abrasive Grains)

The abrasive grains contain a hydroxide of a tetravalent metal element. The "hydroxide of a tetravalent metal element" is a compound containing a tetravalent metal ion ($M^{4+}$) and at least one hydroxide ion ($OH^-$). The hydroxide of a tetravalent metal element may contain an anion (for example, nitrate ion $NO_3^-$ and a sulfate ion $SO_4^{2-}$) other than a hydroxide ion. For example, the hydroxide of a tetravalent metal element may contain an anion (for example, a nitrate ion $NO_3^-$ and a sulfate ion $SO_4^{2-}$) bound to the tetravalent metal element.

Compared to abrasive grains composed of silica, ceria, or the like, the abrasive grains containing a hydroxide of a tetravalent metal element have high reactivity with silicon oxide that is an insulating material and can polish silicon oxide at a high polishing rate. Furthermore, according to the abrasive grains containing a hydroxide of a tetravalent metal element, it is easy to suppress the formation of scratches on a polished surface. Examples of abrasive grains other than the abrasive grains containing a hydroxide of a tetravalent metal element include abrasive grains containing silica, alumina, ceria, and the like. Furthermore, as the abrasive grains containing a hydroxide of a tetravalent metal element, composite particles containing a hydroxide of a tetravalent metal element and silica, and the like can also be used.

From the viewpoint of easily obtaining excellent polishing selectivity of silicon oxide with respect to silicon nitride, the hydroxide of a tetravalent metal element preferably contains at least one selected from the group consisting of a hydroxide of a rare earth metal element and a hydroxide of zirconium, and more preferably contains a hydroxide of a rare earth metal element. Examples of the rare earth metal element that can adopt tetravalence include lanthanoids such as cerium, praseodymium, or terbium, and among these, from the viewpoint that a polishing rate for an insulating material (silicon oxide or the like) is easily improved, a lanthanoid is preferred and cerium is more preferred. In other words, the abrasive grains more preferably contain cerium hydroxide as the hydroxide of a tetravalent metal element. A hydroxide of a rare earth metal element and hydroxide of zirconium may be used in combination, or two or more kinds from hydroxides of rare earth metal elements can be selected and used.

In the abrasive grains containing a hydroxide of a tetravalent metal element, the content of the hydroxide of a tetravalent metal element is preferably 80% by mass or more, more preferably 90% by mass or more, further preferably 95% by mass or more, particularly preferably 98% by mass or more, extremely preferably 99% by mass or more, on the basis of the whole abrasive grains (the whole abrasive grains contained in the polishing liquid). From the viewpoints that the polishing liquid is easily prepared and the polishing characteristics are also further excellent, it is most preferable that the abrasive grains are substantially composed of a hydroxide of a tetravalent metal element (substantially 100% by mass of the abrasive grains are particles of the hydroxide of a tetravalent metal element). In particular, the content of the cerium hydroxide in the abrasive grains is preferably in the above range.

The average particle diameter of the abrasive grains is preferably 0.1 nm or more, more preferably 0.5 nm or more, further preferably 1 nm or more, particularly preferably 2 nm or more, extremely preferably 3 nm or more, highly preferably 5 nm or more, even more preferably 10 nm or more, and further preferably 12 nm or more, from the viewpoint of easily improving the polishing rate for an insulating material (silicon oxide or the like). The average particle diameter of the abrasive grains is preferably 100 nm or less, more preferably 50 nm or less, further preferably 30 nm or less, particularly preferably 20 nm or less, extremely preferably 15 nm or less, and highly preferably 12 nm or less, from the viewpoint of further easily suppressing scratches on a polished surface. From these viewpoints, the average particle diameter of the abrasive grains is preferably 0.1 to 100 nm.

The "average particle diameter" of the abrasive grains means an average secondary particle diameter of the abrasive grains in the polishing liquid. The average particle diameter of the abrasive grains can be measured by using a light diffraction scattering type particle size distribution meter (for example, trade name: DelsaMax PRO manufactured by Beckman Coulter, Inc.). In the measurement method using trade name: DelsaMax PRO manufactured by Beckman Coulter, Inc., specifically, for example, about 0.5 mL (L represents "liter"; the same applies hereinafter) of the polishing liquid is poured in a cell for measurement having a size of 12.5 mm×12.5 mm×45 mm (height) and then the cell is set in the apparatus. Measurement is performed at 25° C. with the refractive index set to 1.333 and the viscosity set to 0.887 mPa·s as the measuring sample information, and the value displayed as Unimodal Size Mean (cumulant diameter) can be adopted as the average particle diameter of the abrasive grains.

The zeta potential of the abrasive grains in the polishing liquid is preferably in the following range. The zeta potential of the abrasive grains is preferably positive (exceeds 0 mV) from the viewpoint of easily obtaining excellent polishing selectivity of silicon oxide with respect to silicon nitride. The zeta potential (ζ [mV]) can be measured using a zeta potential measuring device (for example, DelsaNano C (device name) manufactured by Beckman Coulter, Inc.). The zeta potential of the abrasive grains in the polishing liquid can be obtained, for example, by putting the polishing liquid in a dense cell unit (cell for a high-concentration sample) for the zeta potential measuring device and then measuring.

The content of the abrasive grains is preferably in the following range on the basis of the total mass of the polishing liquid, from the viewpoint of easily obtaining excellent polishing selectivity of silicon oxide with respect to silicon nitride. The content of the abrasive grains is preferably 0.001% by mass or more, more preferably 0.005% by mass or more, further preferably 0.01% by mass or more, particularly preferably 0.03% by mass or more, extremely preferably 0.04% by mass or more, and highly preferably 0.05% by mass or more. The content of the abrasive grains is preferably 10% by mass or less, more preferably 5% by mass or less, further preferably 1% by mass or less, particularly preferably 0.5% by mass or less, extremely preferably 0.1% by mass or less, highly preferably 0.08% by mass or less, and even more preferably 0.05% by mass or less. From these viewpoints, the content of the abrasive grains is preferably 0.001 to 10% by mass.

(Additive)

The polishing liquid of the present embodiment contains an additive. The "additive" refers to a substance that is contained in the polishing liquid in addition to the abrasive grains and water.

[Acid Component A]

The polishing liquid of the present embodiment contains a monovalent acid component A having no carboxy group (—COOH). The "monovalent acid component having no carboxy group" means an acid component that does not have a carboxy group (also encompassing a carboxylate group ($—COO^-$) obtained by dissociation of a hydrogen atom) in the molecule whose valence of the acid is monovalent. The acid component A may be a monovalent acid component that does not have a carboxy group and a carboxylate group (a functional group in which a hydrogen atom of a carboxy group is substituted with a metal atom (such as a sodium atom or a potassium atom)).

By using the acid component A, it is possible to obtain excellent polishing selectivity of silicon oxide with respect to silicon nitride while preventing the aggregation of the abrasive grains, or the like. From the viewpoint of easily obtaining excellent polishing selectivity of silicon oxide with respect to silicon nitride, the acid component A preferably contains an organic acid component (an organic acid and an organic acid derivative), more preferably contains at least one selected from the group consisting of a sulfonic acid compound (sulfonic acid and sulfonate) and a sulfinic acid compound (sulfinic acid and sulfinate), and further preferably contains a sulfonic acid compound. Examples of the sulfonate and the sulfinate include a sodium salt and a potassium salt.

From the viewpoint of easily obtaining excellent polishing selectivity of silicon oxide with respect to silicon nitride, the acid component A preferably contains at least one aminosulfonic acid compound selected from the group consisting of aminosulfonic acid and aminosulfonate. The aminosulfonic acid compound has an amino group as a cationic portion and a sulfonic acid group or a sulfonate group as an anionic portion. Examples of the aminosulfonic acid compound include aromatic aminosulfonic acid, aliphatic aminosulfonic acid, sulfamic acid, and salts of these.

The aromatic aminosulfonic acid is defined as an aromatic compound (preferably, aromatic hydrocarbon) having an amino group, and a sulfonic acid group or a sulfonate group. Examples of the aromatic aminosulfonic acid include aminobenzenesulfonic acid (sulfanilic acid (also known as: 4-aminobenzenesulfonic acid), metanilic acid (also known as: 3-aminobenzenesulfonic acid), orthanilic acid (also known as: 2-aminobenzenesulfonic acid), or the like), diaminobenzenesulfonic acid (2,4-diaminobenzenesulfonic acid, 3,4-diaminobenzenesulfonic acid, or the like), and aminonaphthalenesulfonic acid.

Examples of the aliphatic aminosulfonic acid include aminomethanesulfonic acid, aminoethanesulfonic acid (for example, 1-aminoethanesulfonic acid, and 2-aminoethanesulfonic acid (also known as taurine)), and aminopropanesulfonic acid (for example, 1-aminopropan-2-sulfonic acid and 2-aminopropan-1-sulfonic acid).

From the viewpoint of easily obtaining excellent polishing selectivity of silicon oxide with respect to silicon nitride, the acid component A preferably contains at least one selected from the group consisting of sulfanilic acid, metanilic acid, sulfamic acid, and salts of these, and more preferably contains sulfanilic acid and sulfanilate.

The pKa of the acid component A is preferably 4.50 or less, more preferably 4.10 or less, further preferably 4.00 or less, particularly preferably 3.80 or less, extremely preferably 3.60 or less, highly preferably 3.40 or less, even more preferably 3.20 or less, and further preferably 3.10 or less, from the viewpoint of easily obtaining excellent polishing selectivity of silicon oxide with respect to silicon nitride. The pKa of the acid component A may be 0 or more, 0.50 or more, 1.00 or more, 1.50 or more, 2.00 or more, 2.50 or more, or 3.00 or more. The "pKa" means an acid dissociation constant for a dissociable acidic group and is a negative common logarithm of the equilibrium constant Ka of this group. The value (25° C.) of the "pKa" of the acid component A can be measured by the method described in Examples described below.

The content of the acid component A is preferably in the following range on the basis of the total mass of the polishing liquid, from the viewpoint of easily obtaining excellent polishing selectivity of silicon oxide with respect to silicon nitride. The content of the acid component A is preferably 0.001% by mass or more, more preferably 0.005% by mass or more, further preferably 0.01% by mass or more, particularly preferably 0.015% by mass or more, and extremely preferably 0.02% by mass or more. The content of the acid component A is preferably 1% by mass or less, more preferably 0.5% by mass or less, further preferably 0.3% by mass or less, particularly preferably 0.1% by mass or less, extremely preferably 0.09% by mass or less, highly preferably 0.08% by mass or less, even more preferably 0.07% by mass or less, further preferably 0.06% by mass or less, particularly preferably 0.05% by mass or less, extremely preferably 0.04% by mass or less, highly preferably 0.03% by mass or less, and even more preferably 0.02% by mass or less. From these viewpoints, the content of the acid component A is preferably 0.001 to 1% by mass. The content of the acid component A may be 0.03% by mass or more, 0.04% by mass or more, 0.05% by mass or more, 0.06% by mass or more, 0.07% by mass or more, 0.08% by mass or more, 0.09% by mass or more, or 0.1% by mass or more. The content of the acid component A may be 0.015% by mass or less or 0.01% by mass or less. From the same viewpoints, the content of the sulfonic acid compound preferably satisfies these numerical ranged on the basis of the total mass of the polishing liquid.

The content of the sulfonic acid compound A in the acid component contained in the polishing liquid (basis: the total mass of the acid component), the content of the sulfonic acid compound in the acid component contained in the polishing liquid (basis: the total mass of the acid component), and/or the content of the sulfonic acid compound of the acid component A (basis: the total mass of the acid component A) is preferably 80% by mass or more, more preferably 90% by mass or more, further preferably 95% by mass or more, particularly preferably 98% by mass or more, and extremely preferably 99% by mass or more, from the viewpoint of easily obtaining excellent polishing selectivity of silicon oxide with respect to silicon nitride. The acid component contained in the polishing liquid may be an embodiment substantially composed of the acid component A (substantially 100% by mass of the acid component contained in the polishing liquid is the acid component A). The acid component contained in the polishing liquid may be an embodiment substantially composed of a sulfonic acid compound (substantially 100% by mass of the acid component contained in the polishing liquid is the sulfonic acid compound). The acid component A may be an embodiment substantially composed of a sulfonic acid compound (substantially 100% by mass of the acid component A is the sulfonic acid compound).

The mass ratio of the content of the acid component A to the content of the abrasive grains (the content of the acid component A/the content of the abrasive grains) is preferably in the following range from the viewpoint of easily obtaining excellent polishing selectivity of silicon oxide with respect to silicon nitride. The mass ratio is preferably 5 or less, more preferably 3 or less, further preferably 2 or less, particularly preferably 1.8 or less, extremely preferably 1.6 or less, highly preferably 1.5 or less, even more preferably 1.4 or less, further preferably 1.2 or less, particularly preferably 1 or less, and extremely preferably 0.8 or less. The mass ratio is preferably 0.01 or more, more preferably 0.05 or more, further preferably 0.1 or more, particularly preferably 0.2 or more, extremely preferably 0.3 or more, and highly preferably 0.4 or more. From these viewpoints, the mass ratio is preferably 0.01 to 5. The mass ratio may be 0.5 or less or 0.4 or less. The mass ratio may be 0.5 or more, 0.8 or more, 1 or more, 1.2 or more, 1.4 or more, 1.5 or more, 1.6 or more, 1.8 or more, or 2 or more. From the same viewpoints, the mass ratio of the content of the sulfonic acid compound to the content of the abrasive grains preferably satisfies these mass ratios.

[Non-Ionic Polymer]

The polishing liquid of the present embodiment contains a non-ionic polymer (nonionic polymer). The "non-ionic polymer" is a polymer that does not have a cationic group and a group capable of being ionized to a cationic group, and an anionic group and a group capable of being ionized to an anionic group in a main chain or a side chain. Examples of the cationic group include an amino group, an imino group, and a cyano group, and examples of the anionic group include a carboxy group, a phosphoric acid group, and a sulfonic acid group. The non-ionic polymer has a plurality of the same types of structure units (repeating units). By using the non-ionic polymer, it is possible to obtain excellent polishing selectivity of silicon oxide with respect to silicon nitride while preventing the aggregation of the abrasive grains, or the like.

Examples of the non-ionic polymer include a glycerin-based polymer, a polyoxyalkylene compound, polyvinyl alcohol, and polyvinylpyrrolidone.

Examples of the glycerin-based polymer include polyglycerol and a polyglycerol derivative. Examples of the polyglycerol derivative include polyoxyalkylene polyglyceryl ether, polyglycerol fatty acid ester, and polyglycerol alkyl ether.

The polyoxyalkylene compound is a compound having a polyoxyalkylene chain. Examples of the polyoxyalkylene compound include a polyalkylene glycol and a polyoxyalkylene derivative.

Examples of the polyalkylene glycol include polyethylene glycol, polypropylene glycol, and polybutylene glycol.

Examples of the polyoxyalkylene derivative include a compound in which a substituent is introduced into polyalkylene glycol, and a compound in which polyalkylene oxide is added to an organic compound. Examples of the substituent include an alkyl ether group, an alkyl phenyl ether group, a phenyl ether group, a styrenated phenyl ether group, a fatty acid ester group, and a glycol ester group. Examples of the polyoxyalkylene derivative include an aromatic polyoxyalkylene compound, polyoxyalkylene alkyl ether, polyoxyalkylene sorbitan fatty acid ester, and polyoxyalkylene fatty acid ester.

The aromatic polyoxyalkylene compound is a compound in which a substituent having an aromatic ring is introduced into a polyoxyalkylene chain. The aromatic ring may be directly bonded or not be directly bonded to a polyoxyalkylene chain. The aromatic ring may be a monocyclic or polycyclic. The aromatic polyoxyalkylene compound may have a structure in which a plurality of polyoxyalkylene chains are bonded via a substituent having an aromatic ring. From the viewpoint of easily obtaining excellent polishing selectivity of silicon oxide with respect to silicon nitride, the polyoxyalkylene chain is preferably at least one selected from the group consisting of a polyoxyethylene chain, a polyoxypropylene chain, and a polyoxyethylene-polyoxypropylene chain.

In a case where the aromatic ring is positioned at the terminal of the aromatic polyoxyalkylene compound, examples of the substituent having an aromatic ring include an aryl group. Examples of the aryl group include monocyclic aromatic groups such as a phenyl group, a benzyl group, a tolyl group, and a xylyl group; and polycyclic aromatics such as a naphthyl group, and such aromatic groups may further have a substituent. Examples of the substituent introduced into the aromatic group include an alkyl group, a vinyl group, an allyl group, an alkenyl group, an alkynyl group, a styrene group, and an aromatic group, and an alkyl group or a styrene group is preferred from the viewpoint of easily obtaining excellent polishing selectivity of silicon oxide with respect to silicon nitride.

In a case where the aromatic ring is positioned in the main chain of the aromatic polyoxyalkylene compound, examples of the substituent having an aromatic ring include an arylene group. Examples of the arylene group include monocyclic aromatic groups such as a phenylene group, a tolylene group, and a xylylene group; and polycyclic aromatics such as a naphthylene group, and these aromatic groups may further have a substituent. Examples of the substituent introduced into the aromatic group include an alkyl group, a vinyl group, an allyl group, an alkenyl group, an alkynyl group, a styrene group, and an aromatic group.

From the viewpoint of easily obtaining excellent polishing selectivity of silicon oxide with respect to silicon nitride, the aromatic polyoxyalkylene compound preferably contains at least one selected from the group consisting of a compound represented by General Formula (I) below and a compound represented by General Formula (II) below.

$$R^{11}\text{—O—}(R^{12}\text{—O})_m\text{—H} \quad \text{(I)}$$

[In Formula (I), $R^{11}$ represents an aryl group which may have a substituent, $R^{12}$ represents an alkylene group having 1 to 5 carbon atoms which may have a substituent, and "m" represents an integer of 10 or more.]

$$\text{H—}(\text{O—}R^{23})_{n1}\text{—O—}R^{21}\text{—}R^{25}\text{—}R^{22}\text{—O—}(R^{24}\text{—O})_{n2}\text{—H} \quad \text{(II)}$$

[In Formula (II), $R^{21}$ and $R^{22}$ each independently represent an arylene group which may have a substituent, $R^{23}$, $R^{24}$, and $R^{25}$ each independently represent an alkylene group having 1 to 5 carbon atoms which may have a substituent, and "n1" and "n2" each independently represent an integer of 15 or more.]

From the viewpoint of easily obtaining excellent polishing selectivity of silicon oxide with respect to silicon nitride, it is preferable that Formula (I) satisfies at least one of the following conditions.

- $R^{11}$ is preferably the aforementioned aryl group shown as an example of a substituent having an aromatic ring, more preferably a phenyl group into which a styrene group or an alkyl group is introduced as a substituent, and further preferably a phenyl group into which a plurality (for example, two) of styrene groups are introduced as a substituent.
- $R^{12}$ is preferably an alkylene group having 1 to 3 carbon atoms and more preferably an ethylene group.
- "m" is preferably 15 or more and more preferably 30 or more.
- "m" is preferably 20000 or less, more preferably 10000 or less, further preferably 5000 or less, and particularly preferably 1000 or less.

Examples of the aromatic polyoxyalkylene compound represented by Formula (I) include polyoxyalkylene phenyl ether, polyoxyalkylene alkyl phenyl ether, polyoxyalkylene styrenated phenyl ether, polyoxyalkylene distyrenated phenyl ether, polyoxyalkylene cumyl phenyl ether, and polyoxyalkylene benzyl ether. Specific examples of the aromatic polyoxyalkylene compound represented by Formula (I) include polyoxyethylene alkyl phenyl ether, polyoxyethylene nonylpropenyl phenyl ether, polyoxyethylene phenyl ether, polyoxyethylene styrenated phenyl ether, polyoxyethylene distyrenated phenyl ether, polyoxypropylene phenyl ether, polyoxyethylene cumyl phenyl ether, and polyoxyethylene benzyl ether.

Examples of the aromatic polyoxyalkylene compound represented by Formula (II) include polyoxyalkylene bisphenol ether. Specific examples of the aromatic polyoxyalkylene compound represented by Formula (II) include 2,2-bis(4-polyoxyethylene oxyphenyl) propane.

From the viewpoint of easily obtaining excellent polishing selectivity of silicon oxide with respect to silicon nitride, the non-ionic polymer preferably contains at least one selected from the group consisting of a glycerin-based polymer and a polyoxyalkylene compound and preferably contains a glycerin-based polymer and a polyoxyalkylene compound. From the viewpoint of easily obtaining excellent polishing selectivity of silicon oxide with respect to silicon nitride, the polyoxyalkylene compound preferably contains an aromatic polyoxyalkylene compound, more preferably contains at least one selected from the group consisting of polyoxyalkylene styrenated phenyl ether and polyoxyalkylene distyrenated phenyl ether, and further preferably contains at least one selected from the group consisting of phenyl ether and polyoxyethylene polyoxyethylene styrenated distyrenated phenyl ether.

The polishing liquid of the present embodiment preferably contains a non-ionic polymer having a weight average molecular weight described below from the viewpoint of easily obtaining excellent polishing selectivity of silicon oxide with respect to silicon nitride. The weight average molecular weight of the non-ionic polymer is preferably 100 or more, more preferably 200 or more, further preferably 300 or more, particularly preferably 500 or more, extremely preferably 600 or more, highly preferably 700 or more, and even more preferably 750 or more. The weight average molecular weight of the non-ionic polymer is preferably 100000 or less, more preferably 50000 or less, further preferably 10000 or less, particularly preferably 5000 or less, particularly preferably 3000 or less, extremely preferably 1000 or less, highly preferably 800 or less, and even more preferably 750 or less. From these viewpoints, the weight average molecular weight of the non-ionic polymer is preferably 100 to 100000.

The weight average molecular weight of the non-ionic polymer can be measured, for example, by gel permeation chromatography (GPC) using a calibration curve of polystyrene standards under the following conditions.

Instrument used: Hitachi L-6000 Model [manufactured by Hitachi, Ltd.]

Column: GELPACK GL-R420+GELPACK GL-R430+GELPACK GL-R440 [manufactured by Hitachi Chemical Co., Ltd., trade names, three in total]

Eluent: Tetrahydrofuran Measurement temperature: 40° C.

Flow rate: 1.75 mL/min

Detector: L-3300RI [manufactured by Hitachi, Ltd.]

The content of the non-ionic polymer is preferably in the following range on the basis of the total mass of the polishing liquid, from the viewpoint of easily obtaining excellent polishing selectivity of silicon oxide with respect to silicon nitride. The content of the non-ionic polymer is preferably 0.001% by mass or more, more preferably 0.005% by mass or more, further preferably 0.008% by mass or more, particularly preferably 0.01% by mass or more, extremely preferably 0.03% by mass or more, highly preferably 0.05% by mass or more, even more preferably 0.08% by mass or more, further preferably 0.1% by mass or more, particularly preferably 0.3% by mass or more, extremely preferably 0.4% by mass or more, highly preferably 0.5% by mass or more, and even more preferably 0.51% by mass or more. The content of the non-ionic polymer is preferably 10% by mass or less, more preferably 5% by mass or less, further preferably 1% by mass or less, particularly preferably 0.8% by mass or less, extremely preferably 0.7% by mass or less, highly preferably 0.6% by mass or less, and even more preferably 0.55% by mass or less. From these viewpoints, the content of the non-ionic polymer is preferably 0.001 to 10% by mass. The content of the non-ionic polymer may be 0.51% by mass or less, 0.5% by mass or less, 0.1% by mass or less, 0.05% by mass or less, or 0.01% by mass or less.

The content of the glycerin-based polymer is preferably in the following range on the basis of the total mass of the polishing liquid, from the viewpoint of easily obtaining excellent polishing selectivity of silicon oxide with respect to silicon nitride. The content of the glycerin-based polymer is preferably 0.001% by mass or more, more preferably 0.005% by mass or more, further preferably 0.008% by mass or more, particularly preferably 0.01% by mass or more, extremely preferably 0.03% by mass or more, highly preferably 0.05% by mass or more, even more preferably 0.08% by mass or more, further preferably 0.1% by mass or more, particularly preferably 0.3% by mass or more, extremely preferably 0.4% by mass or more, and highly preferably 0.5% by mass or more. The content of the glycerin-based polymer is preferably 10% by mass or less, more preferably 5% by mass or less, further preferably 1% by mass or less, particularly preferably 0.8% by mass or less, extremely preferably 0.7% by mass or less, highly preferably 0.6% by mass or less, and even more preferably 0.5% by mass or less. From these viewpoints, the content of the glycerin-based polymer is preferably 0.001 to 10% by mass.

The content of the polyoxyalkylene compound is preferably in the following range on the basis of the total mass of the polishing liquid, from the viewpoint of easily obtaining excellent polishing selectivity of silicon oxide with respect to silicon nitride. The content of the polyoxyalkylene compound is preferably 0.001% by mass or more, more preferably 0.005% by mass or more, further preferably 0.008% by mass or more, and particularly preferably 0.01% by mass or more. The content of the polyoxyalkylene compound is preferably 1% by mass or less, more preferably 0.5% by mass or less, further preferably 0.1% by mass or less, particularly preferably 0.05% by mass or less, extremely preferably 0.03% by mass or less, and highly preferably 0.01% by mass or less. From these viewpoints, the content of the polyoxyalkylene compound is preferably 0.001 to 1% by mass.

In a case where the non-ionic polymer contains a glycerin-based polymer, the content of the glycerin-based polymer in the non-ionic polymer is preferably 50% by mass or more, more preferably more than 50% by mass, further preferably 80% by mass or more, particularly preferably 90% by mass or more, extremely preferably 95% by mass or more, and highly preferably 98% by mass or more, on the basis of the total mass of the non-ionic polymer, from the viewpoint of easily obtaining excellent polishing selectivity of silicon oxide with respect to silicon nitride. The content of the glycerin-based polymer may be 99% by mass or more. The non-ionic polymer may be an embodiment substantially composed of a glycerin-based polymer (substantially 100% by mass of the non-ionic polymer is the glycerin-based polymer).

In a case where the non-ionic polymer contains a polyoxyalkylene compound, the content of the polyoxyalkylene compound in the non-ionic polymer is preferably 0.1% by mass or more, more preferably 0.5% by mass or more, further preferably 1% by mass or more, particularly preferably 1.5% by mass or more, and extremely preferably 1.9% by mass or more, on the basis of the total mass of the non-ionic polymer, from the viewpoint of easily obtaining excellent polishing selectivity of silicon oxide with respect to silicon nitride. The content of the polyoxyalkylene compound may be 95% by mass or more, 98% by mass or more, or 99% by mass or more. The non-ionic polymer may be an embodiment substantially composed of a polyoxyalkylene compound (substantially 100% by mass of the non-ionic polymer is the polyoxyalkylene compound). The content of the polyoxyalkylene compound may be 50% by mass or less, less than 50% by mass, 30% by mass or less, 10% by mass or less, 5% by mass or less, 3% by mass or less, or 2% by mass or less.

In a case where the non-ionic polymer contains a glycerin-based polymer and a polyoxyalkylene compound, the mass ratio of the content of the glycerin-based polymer to the content of the polyoxyalkylene compound (the content of the glycerin-based polymer/the content of the polyoxyalkylene compound) is preferably in the following range, from the viewpoint of easily obtaining excellent polishing selectivity of silicon oxide with respect to silicon nitride. The mass ratio is preferably 1 or more, more preferably 5 or more, further preferably 10 or more, particularly preferably 20 or more, extremely preferably 30 or more, highly preferably 40 or more, and even more preferably 50 or more. The mass ratio is preferably 200 or less, more preferably 150 or less, further preferably 100 or less, particularly preferably 80 or less, extremely preferably 60 or less, and highly preferably 50 or less. From these viewpoints, the mass ratio is preferably 1 to 200.

The mass ratio of the content of the non-ionic polymer to the content of the abrasive grains (the content of the non-ionic polymer/the content of the abrasive grains) is preferably in the following range from the viewpoint of easily obtaining excellent polishing selectivity of silicon oxide with respect to silicon nitride. The mass ratio is preferably 50 or less, more preferably 30 or less, further preferably 20 or less, particularly preferably 15 or less, extremely preferably 12 or less, and highly preferably 11 or less. The mass ratio is preferably 0.1 or more, more preferably 0.2 or more, further preferably 0.5 or more, particularly preferably 1 or more, extremely preferably 5 or more, highly preferably 10 or more, and even more preferably 10.2 or more. From these viewpoints, the mass ratio is preferably 0.1 to 50.

The mass ratio of the content of the non-ionic polymer to the content of the acid component A (the content of the non-ionic polymer/the content of the acid component A) is preferably in the following range from the viewpoint of easily obtaining excellent polishing selectivity of silicon oxide with respect to silicon nitride. The mass ratio is preferably 100 or less, more preferably 80 or less, further preferably 50 or less, particularly preferably 40 or less, extremely preferably 30 or less, and highly preferably 26 or less. The mass ratio is preferably 0.01 or more, more preferably 0.05 or more, further preferably 0.1 or more, particularly preferably 0.5 or more, extremely preferably 1 or more, highly preferably 5 or more, even more preferably 6 or more, further preferably 7 or more, particularly preferably 8 or more, extremely preferably 10 or more, highly preferably 15 or more, even more preferably 20 or more, and further preferably 25 or more. From these viewpoints, the mass ratio is preferably 0.01 to 100.

[Base Component]

The polishing liquid of the present embodiment may contain a base component. Since the pH buffering effect tends to be obtained when the polishing liquid containing the acid component A further contains a base component, the pH of the polishing liquid is easily stabilized, and thus excellent polishing selectivity of silicon oxide with respect to silicon nitride is easily obtained. Examples of the base component include a compound having an amino group (such as a heterocyclic amine and an alkylamine), ammonia, and sodium hydroxide. Regarding an amphoteric compound, in a case where the isoelectric point (pI) of this compound exceeds 4.5, this compound is regarded as the base component. Examples of the compound having an isoelectric point of more than 4.5 include glycine. From the viewpoint of further easily stabilizing the pH of the polishing liquid, the base component preferably contains a compound having an amino group and more preferably contains a heterocyclic amine.

The heterocyclic amine is an amine having at least one heterocyclic ring. Examples of the heterocyclic amine include compounds having a pyrrolidine ring, a pyrrole ring, an imidazole ring, a pyrazole ring, an oxazole ring, a thiazole ring, a pyridine ring, a pyrazine ring, a pyrimidine ring, a pyridazine ring, a triazine ring, a tetrazine ring, and the like. From the viewpoint of easily obtaining excellent polishing selectivity of silicon oxide with respect to silicon nitride, the base component preferably contains a pyrazole compound (a compound having a pyrazole ring), more preferably contains dimethylpyrazole, and further preferably contains 3,5-dialkylpyrazole.

The content of the base component is preferably in the following range on the basis of the total mass of the polishing liquid, from the viewpoint of easily obtaining excellent polishing selectivity of silicon oxide with respect to silicon nitride. The content of the base component is preferably 0.001% by mass or more, more preferably 0.003% by mass or more, further preferably 0.005% by mass or more, particularly preferably 0.008% by mass or more, extremely preferably 0.01% by mass or more, highly preferably 0.03% by mass or more, and even more preferably 0.05% by mass or more. The content of the base component is preferably 1% by mass or less, more preferably 0.8% by mass or less, further preferably 0.5% by mass or less, particularly preferably 0.3% by mass or less, extremely preferably 0.2% by mass or less, highly preferably 0.1% by mass or less, even more preferably 0.08% by mass or less, and further preferably 0.05% by mass or less. From these viewpoints, the content of the base component is preferably 0.001 to 1% by mass. The polishing liquid of the present embodiment may not contain a base component (the content of the base component may be substantially 0% by mass).

In a case where the polishing liquid of the present embodiment contains the acid component A and the base component, the mass ratio of the content of the base component to the content of the acid component A (the content of the base component/the content of the acid component A) is preferably in the following range from the viewpoint of easily obtaining excellent polishing selectivity of silicon oxide with respect to silicon nitride. The mass ratio is preferably 0.1 or more, more preferably 0.3 or more, further preferably 0.5 or more, particularly preferably 0.6 or more, extremely preferably 0.7 or more, highly preferably 1 or more, even more preferably 1.25 or more, further preferably 1.5 or more, particularly preferably 2 or more, and extremely preferably 2.5 or more. The mass ratio is preferably 10 or less, more preferably 8 or less, further preferably 5 or less, particularly preferably 4 or less, extremely preferably 3 or less, and highly preferably 2.5 or less. From these viewpoints, the mass ratio is preferably 0.1 to 10.

[Other Additives]

The polishing liquid of the present embodiment may contain an arbitrary additive (excluding a compound corresponding to the acid component A, the non-ionic polymer, or the base component mentioned above). Examples of the arbitrary additive include oxidizing agents (such as hydrogen peroxide), alcohols (such as triethylol ethane and 3-methoxy-3-methyl-1-butanol), acid components other than the acid component A (such as an acid component having a carboxy group and a divalent or higher acid component). The polishing liquid of the present embodiment may not contain an acid component containing a carboxy group (the content of the acid component having a carboxy group may be substantially 0% by mass on the basis of the total mass of the polishing liquid), and may not contain a divalent or higher acid component (the content of the divalent or higher acid component may be substantially 0% by mass on the basis of the total mass of the polishing liquid).

(Water)

The polishing liquid of the present embodiment can contain water. Examples of water include deionized water and ultrapure water. The content of the water may correspond to the remaining of the polishing liquid from which the contents of other constituent components are removed.

(pH)

From the viewpoint of obtaining excellent polishing selectivity of silicon oxide with respect to silicon nitride, the pH of the polishing liquid of the present embodiment is 4.5 or less. From the viewpoint of easily obtaining excellent polishing selectivity of silicon oxide with respect to silicon nitride, the pH of the polishing liquid is preferably 4.4 or less. From the viewpoint of easily obtaining excellent polishing selectivity of silicon oxide with respect to silicon nitride, the pH of the polishing liquid is preferably 1.0 or more, more preferably 1.5 or more, further preferably 2.0 or more, particularly preferably 2.5 or more, extremely preferably 3.0 or more, highly preferably 3.5 or more, even more preferably 3.6 or more, further preferably 3.7 or more, particularly preferably 3.8 or more, extremely preferably 4.0 or more, highly preferably 4.1 or more, even more preferably 4.2 or more, and further preferably 4.4 or more. From these viewpoints, the pH of the polishing liquid is preferably 1.0 to 4.5. The pH of the polishing liquid may be 4.2 or less, 4.1 or less, 4.0 or less, 3.8 or less, 3.7 or less, 3.6 or less, 3.5 or less, or 3.4 or less. The pH of the polishing liquid is defined as the pH at a liquid temperature of 25° C.

The pH of the polishing liquid of the present embodiment can be measured by using a pH meter (for example, Model D-51 manufactured by HORIBA, Ltd.). For example, after performing 3-point calibration of the pH meter using a phthalate pH buffer solution (pH: 4.01), a neutral phosphate pH buffer solution (pH: 6.86), and a borate pH buffer solution (pH: 9.18) as standard buffer solutions, an electrode of the pH meter is placed in the polishing liquid for 3 minutes or longer, and the value after stabilization is measured. The liquid temperature of both the standard buffer solution and the polishing liquid are set to 25° C.

The polishing liquid of the present embodiment may be stored as a one-pack type polishing liquid containing at least abrasive grains containing a hydroxide of a tetravalent metal element, an acid component A, and a non-ionic polymer, or as a multi-pack type (for example, two-pack type) polishing liquid set containing constituent components of the aforementioned polishing liquid divided into a slurry (first liquid) and an additive liquid (second liquid) such that the slurry and additive liquid are mixed to form the aforementioned polishing liquid. The slurry contains, for example, at least abrasive grains and water. The additive liquid contains, for example, at least an acid component A, a non-ionic polymer, and water. The base component, other additives, and the like are preferably contained in the additive liquid of the slurry and the additive liquid. The constituent components of the aforementioned polishing liquid may be stored as a polishing liquid set divided into three or more liquids.

In the aforementioned polishing liquid set, the slurry and the additive liquid are mixed immediately before polishing or during polishing to prepare the polishing liquid. A one-pack type polishing liquid may be stored as a stock solution for a polishing liquid with a reduced water content and used by dilution with water during the polishing. The multi-pack type polishing liquid set may be stored as a stock solution for a slurry and a stock solution for an additive liquid with a reduced water content, and used by dilution with water during the polishing.

<Polishing Method>

A polishing method of the present embodiment includes a polishing step of polishing a surface to be polished by using the polishing liquid of the present embodiment. In the polishing step, the material to be polished of the surface to be polished is polished so as to be removed. The surface to be polished may contain silicon oxide and silicon nitride. That is, the surface to be polished may have a portion to be polished composed of silicon oxide and a portion to be polished composed of silicon nitride. The polishing step may be a step of polishing a surface to be polished containing silicon oxide and silicon nitride by using the polishing liquid of the present embodiment so as to selectively remove silicon oxide with respect to silicon nitride. In the polishing liquid used in the polishing step, the polishing liquid may be the aforementioned one-pack type polishing liquid or may be a polishing liquid obtained by mixing a slurry and an additive liquid in the aforementioned polishing liquid set.

In the polishing step, for example, while a surface to be polished of a base substrate is pressed on a polishing pad (polishing cloth) of a polishing platen, the aforementioned polishing liquid is supplied between the surface to be polished and the polishing pad, and the base substrate and the polishing platen are relatively moved to polish the surface to be polished.

As the base substrate that is to be polished, a substrate to be polished or the like is exemplified. As the substrate to be polished, for example, a base substrate in which a material to be polished is formed on a substrate for semiconductor element production (for example, a semiconductor substrate in which an STI pattern, a gate pattern, a wiring pattern, or the like is formed) is exemplified. The portion to be polished of the substrate to be polished may contain silicon oxide and silicon nitride. The portion to be polished may be in the form of a film (film to be polished) or may be a silicon oxide film, a silicon nitride film, or the like.

In the polishing method of the present embodiment, as a polishing apparatus, it is possible to use a common polishing apparatus which has a holder capable of holding a base substrate having a surface to be polished and a polishing platen to which a polishing pad can be pasted. A motor or the like in which the number of rotations can be changed may be attached to each of the holder and the polishing platen. As the polishing apparatus, for example, a polishing apparatus: Reflexion manufactured by Applied Materials, Inc. can be used.

As the polishing pad, common unwoven cloth, a foamed body, an unfoamed body, and the like can be used. As the material of the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin.

EXAMPLES

Hereinafter, the present disclosure will be described in more detail with reference to examples. However, the present disclosure is not limited to these examples without departing from the technical idea of the present disclosure. For example, the type of materials of the polishing liquid and the blending ratio thereof may be types and ratios other than the types and ratios described in the present examples, and the composition and the structure of the object to be polished may also be compositions and structures other than the compositions and the structures described in the present examples.

<Preparation of Abrasive Grains>

350 g of an aqueous 50% by mass $Ce(NH_4)_2(NO_3)_6$ solution (trade name: CAN50 liquid manufactured by Nihon Kagaku Sangyo Co., Ltd.) was mixed with 7825 g of pure water to obtain a solution. Next, while stirring this solution, 750 g of an aqueous imidazole solution (10% by mass aqueous solution, 1.47 mol/L) was added dropwise thereto at a mixing rate of 5 mL/min to obtain a precipitate containing cerium hydroxide. The cerium hydroxide was synthesized at a temperature of 25° C. and a stirring speed of 400 $min^{-1}$. The stirring was carried out using a 3-blade pitch paddle with a total blade section length of 5 cm.

The obtained precipitate (precipitate containing cerium hydroxide) was subjected to centrifugal separation (4000 min-1, for 5 minutes), and then subjected to solid-liquid separation with removal of a liquid phase by decantation. 10 g of particles obtained by solid-liquid separation and 990 g of water were mixed, and then the particles were dispersed in the water by using an ultrasonic cleaner to prepare a cerium hydroxide slurry (content of abrasive grains: 1.0% by mass) containing abrasive grains containing cerium hydroxide.

<Measurement of Average Particle Diameter>

When the average particle diameter of the abrasive grains (the abrasive grains containing cerium hydroxide) in the cerium hydroxide slurry was measured using trade name: N5 manufactured by Beckman Coulter, Inc., a value of 3 nm was obtained. The measurement method is as follows. First, about 1 mL of a measuring sample (cerium hydroxide slurry, aqueous dispersion liquid) containing 1.0 mass % of abrasive grains was poured into a 1-cm square cell, and the cell was set in N5. Measurement was performed at 25° C. with the refractive index set to 1.333 and the viscosity set to 0.887 mPa·s as the measuring sample information of N5 software.

<Structural Analysis of Abrasive Grains>

An adequate amount of the cerium hydroxide slurry was collected and dried in a vacuum, and thereby the abrasive grains were isolated, and then, sufficient washing was performed with pure water to obtain a sample. When the obtained sample was measured by an FT-IR ATR method, a peak based on nitrate ion ($NO_3^-$) was observed in addition to a peak based on hydroxide ion ($OH^-$). Furthermore, when the same sample was measured by XPS (N-XPS) for nitrogen, a peak based on nitrate ion was observed while no peak based on $NH_4^+$ was observed. These results confirmed that the abrasive grains contained in the cerium hydroxide slurry at least partially contained particles having nitrate ion bonded to cerium element. Furthermore, since particles having hydroxide ion bonded to cerium element were contained at least in a portion of the abrasive grains, it was confirmed that the abrasive grains contained cerium hydroxide. These results confirmed that the cerium hydroxide contained a hydroxide ion bonded to a cerium element.

<Preparation of CMP Polishing Liquid>

Example 1

A CMP polishing liquid containing 0.05% by mass of abrasive grains containing cerium hydroxide, 0.1% by mass of sulfanilic acid, 0.5% by mass of polyglycerol, 0.01% by mass of polyoxyethylene distyrenated phenyl ether, and 0.05% by mass of 3,5-dimethylpyrazole was prepared by mixing 100 g of an additive liquid, which contains 1% by mass of sulfanilic acid, 5% by mass of polyglycerol [non-ionic polymer, manufactured by Sakamoto Yakuhin Kogyo Co., Ltd., trade name: Polyglycerol #750, weight average molecular weight: 750, average degree of polymerization 10], 0.1% by mass of polyoxyethylene distyrenated phenyl ether [non-ionic polymer, manufactured by Kao Corporation, trade name: Emulgen A-500, weight average molecular weight: 3000], 0.5% by mass of 3,5-dimethylpyrazole, and water (balance), 850 g of water, and 50 g of the aforementioned cerium hydroxide slurry.

Examples 2 to 16 and Comparative Examples 1 to 10

CMP polishing liquids having compositions shown in Table 1 and Table 2 were prepared in the same manner as in Example 1, except that the type and the content of the acid component, the non-ionic polymer, and the base component were changed.

Comparative Examples 11 and 12

CMP polishing liquids having compositions shown in Table 2 were prepared in the same manner as in Example 1, except that the type and the content of the acid component, the non-ionic polymer, and the base component were changed and another component X1 or X2 was used.

Acid components A1 to A5, non-ionic polymers P1 to P4, base components B1 and B2, and other components X1 and X2 in the table are as follows. In the case of using a product that is a mixture of a non-ionic polymer and another component, the content of the non-ionic polymer was adjusted so as to satisfy the contents in Table 1 and Table 2.

[Acid Component]

A1: Sulfanilic acid (pKa: 3.01)
A2: Metanilic acid (pKa: 3.81)
A3: Sulfamic acid (pKa: 0.99)
A4: Acetic acid (pKa: 4.76) A5: Bismethylolpropionic acid (pKa: 4.16)

[Non-Ionic Polymer]

P1: Polyglycerol (manufactured by Sakamoto Yakuhin Kogyo Co., Ltd., trade name: Polyglycerol #750, weight average molecular weight: 750, average degree of polymerization: 10)
P2: Polyoxyethylene distyrenated phenyl ether (manufactured by Kao Corporation, trade name: Emulgen A-500, weight average molecular weight: 3000)
P3: Polyglycerol (manufactured by Daicel Corporation, trade name: PGL XPW, weight average molecular weight: 3000, average degree of polymerization: 40)
P4: Polyglycerol (manufactured by Sakamoto Yakuhin Kogyo Co., Ltd., trade name: Polyglycerol #310, weight average molecular weight: 310, average degree of polymerization: 4)

[Base Component]

B1:3,5-Dimethylpyrazole
B2: Glycine

[Other Components]

X1: Triethylol ethane
X2:3-Methoxy-3-methyl-1-butanol

The pKa of the acid component was measured by the following method. A glass comparison electrode (manufactured by HIRANUMA SANGYO Co., Ltd., trade name:

GR-501B) was subjected to 3-point calibration by using a standard buffer solution (phthalate pH buffer solution, pH: 4.01 (25° C.); neutral phosphate pH buffer solution, pH: 6.86 (25° C.); borate pH buffer solution, pH: 9.18 (25° C.)). By using a glass comparison electrode and an automatic titrator (manufactured by HIRANUMA SANGYO Co., Ltd., trade name: COM-2500), 1 mol/L of a sodium hydroxide aqueous solution (manufactured by FUJIFILM Wako Pure Chemical Corporation) was added dropwise with respect to 0.05 mol/L of an aqueous solution of an acid component to perform neutralization titration, thereby obtaining a pH titration curve (X axis: cumulative drop volume, Y axis: pH) and a potential change amount curve (X axis: cumulative drop volume, Y axis: potential change amount (ΔE)). After the cumulative drop volume when the potential change amount (ΔE) near the terminal point of neutralization (equivalence point) reached the maximum value was obtained as the terminal point volume, the pH when the terminal point volume became the half of the terminal point volume (½ of the terminal point volume) was obtained as the pKa of the acid component. In a case where ½ of the terminal point volume was positioned between measurement points, the pKa of the acid component was calculated by linear approximation between the measurement points.

<Evaluation>

(pH of CMP Polishing Liquid)

The pH of the CMP polishing liquid was measured under the following conditions. The results are shown in Table 1 and Table 2.

- Measurement temperature: 25° C.
- Measuring apparatus: Model D-51 manufactured by HORIBA, Ltd.
- Measurement method: After performing 3-point calibration using a standard buffer solution (phthalate pH buffer solution, pH: 4.01 (25° C.); neutral phosphate pH buffer solution, pH: 6.86 (25° C.); borate pH buffer solution, pH: 9.18 (25° C.)), an electrode was placed in the CMP polishing liquid for 3 minutes or longer, and the pH after stabilization was measured with the aforementioned measurement apparatus.

(Zeta Potential of Abrasive Grains in CMP Polishing Liquid)

When the zeta potential of the abrasive grains in the CMP polishing liquid of Example was checked by using DelsaNano C (device name) manufactured by Beckman Coulter, Inc., the zeta potential was confirmed to be a positive zeta potential.

(Particle Diameter of Abrasive Grains)

When the average particle diameter of the abrasive grains (the abrasive grains containing cerium hydroxide) in the CMP polishing liquids of Examples 1 to 16 and Comparative Examples 1 to 12 was measured under the following conditions, a value of 12 nm was obtained.

- Measurement temperature: 25° C.
- Measuring apparatus: trade name: DelsaMax PRO manufactured by Beckman Coulter, Inc.
- Measurement method: About 0.5 mL of the CMP polishing liquid was poured in a cell for measurement (disposable micro cuvette) having a size of 12.5 mm×12.5 mm×45 mm (height) and then the cell was set in the apparatus. Measurement was performed at 25° C. with the refractive index set to 1.333 and the viscosity set to 0.887 mPa·s as the measuring sample information, and the value displayed as Unimodal Size Mean (cumulant diameter) was read off.

(Polishing Rate)

The following blanket wafer was polished by using the aforementioned CMP polishing liquid under the following CMP polishing conditions.

[Blanket Wafer]

- Blanket wafer that has a silicon oxide film having a thickness of 1000 nm on a silicon substrate (diameter: 300 mm)
- Blanket wafer that has a silicon nitride film having a thickness of 250 nm on a silicon substrate (diameter: 300 mm)

[CMP Polishing Conditions]

- Polishing apparatus: Reflexion (manufactured by Applied Materials, Inc.)
- Flow rate of CMP polishing liquid: 200 mL/min
- Substrate to be polished: Aforementioned blanket wafer
- Polishing pad: Foamed polyurethane having closed pores (Model No. IC1010 manufactured by ROHM AND HAAS ELECTRONIC MATERIALS CMP INC.)
- Polishing pressure: 13.8 kPa (2.0 psi)
- Relative speed between substrate to be polished and polishing platen: 100.5 m/min
- Polishing time: 60 seconds
- Washing of wafer: After a CMP treatment, washing was performed with water while applying an ultrasonic wave, and then drying was performed with a spin dryer.

[Calculation of Polishing Rate and Polishing Rate Ratio]

65 film thicknesses of the films to be polished (the silicon oxide film and the silicon nitride film) before and after polishing were measured by using a light interference type film thickness measuring apparatus (device name: F80) manufactured by Filmetrics Japan, Inc. The measurement of 65 film thicknesses was performed at positions of 149 mm, 148 mm, 147 mm, and 145 mm, positions at every 5 mm between 145 mm and −145 mm (140 mm, 135 mm, . . . , −135 mm, and −140 mm), and positions of −145 mm, −147 mm, −148 mm, and −149 mm on the straight line including the center of the wafer on the basis of the center of the wafer (the distance opposite to the plus distance is described as the minus distance on the basis of the center of the wafer). A change amount in film thickness was calculated using an average value of 65 film thicknesses. The polishing rates for materials to be polished (a polishing rate RO of silicon oxide and a polishing rate RN of silicon nitride) were calculated by the following formula on the basis of a change amount of the film thickness and the polishing time. Furthermore, a polishing rate ratio (RO/RN) of the polishing rate RO of silicon oxide to the polishing rate RN of silicon nitride was calculated. The results are shown in Table 1 and Table 2.

Polishing rate [nm/min]=(Film thickness [nm] before polishing−Film thickness [nm] after polishing)/Polishing time [min]

| | | Unit | Example | | | | | | | |
|---|---|---|---|---|---|---|---|---|---|---|
| | | | 1 | 2 | 3 | 4 | 5 | 6 | 7 | 8 |
| Acid | A1 | mass % | 0.1 | 0.08 | 0.02 | 0.1 | 0.09 | 0.08 | 0.08 | 0.08 |
| component | A2 | | — | — | — | — | — | — | — | — |
| | A3 | | — | — | — | — | — | — | — | — |
| Non-ionic | P1 | | 0.5 | 0.5 | 0.5 | 0.5 | 0.5 | 0.5 | — | — |
| polymer | P2 | | 0.01 | 0.01 | 0.01 | — | — | — | 0.01 | — |
| | P3 | | — | — | — | — | — | — | — | 0.05 |
| | P4 | | — | — | — | — | — | — | — | — |

-continued

| | | | | | | | | | | |
|---|---|---|---|---|---|---|---|---|---|---|
| Base component | B1 | | 0.05 | 0.05 | 0.05 | 0.05 | 0.05 | 0.05 | 0.05 | 0.05 |
| | B2 | — | — | — | — | — | — | — | — | — |
| pH | | — | 3.6 | 3.8 | 4.4 | 3.6 | 3.7 | 3.8 | 3.8 | 3.8 |
| Polishing rate | Silicon oxide (RO) | nm/min | 100 | 110 | 220 | 40 | 88 | 110 | 50 | 80 |
| | Silicon nitride (RN) | | 0.1 | 0.1 | 0.4 | 0.5 | 0.5 | 0.1 | 0.5 | 0.5 |
| Polishing rate ratio | RO/RN | — | 1000 | 1100 | 2200 | 100 | 176 | 220 | 500 | 160 |

| | | | Example | | | | | | | |
|---|---|---|---|---|---|---|---|---|---|---|
| | | Unit | 9 | 10 | 11 | 12 | 13 | 14 | 15 | 16 |
| Acid component | A1 | mass % | 0.08 | 0.04 | 0.02 | 0.01 | — | — | — | — |
| | A2 | | — | — | — | — | 0.07 | 0.05 | 0.01 | — |
| | A3 | | — | — | — | — | — | — | — | 0.015 |
| Non-ionic polymer | P1 | | — | 0.5 | 0.5 | 0.5 | 0.5 | 0.5 | 0.5 | 0.5 |
| | P2 | | — | — | — | 0.01 | 0.01 | 0.01 | 0.01 | 0.01 |
| | P3 | | — | — | — | — | — | — | — | — |
| | P4 | | 0.5 | — | — | — | — | — | — | — |
| Base component | B1 | | 0.05 | 0.05 | 0.05 | — | 0.05 | — | — | 0.05 |
| | B2 | — | — | — | — | — | — | 0.2 | — | — |
| pH | | — | 3.8 | 4.2 | 4.4 | 3.5 | 4.1 | 3.7 | 3.4 | 4.4 |
| Polishing rate | Silicon oxide (RO) | nm/min | 120 | 120 | 130 | 41 | 112 | 22 | 47 | 117 |
| | Silicon nitride (RN) | | 0.5 | 0.5 | 4 | 0.1 | 0.1 | 0.1 | 0.1 | 0.1 |
| Polishing rate ratio | RO/RN | — | 240 | 240 | 33 | 410 | 1120 | 220 | 470 | 1170 |

| | | | Comparative Exmaple | | | | | | | | | | | |
|---|---|---|---|---|---|---|---|---|---|---|---|---|---|---|
| | | Unit | 1 | 2 | 3 | 4 | 5 | 6 | 7 | 8 | 9 | 10 | 11 | 12 |
| Acid component | A1 | mass % | — | — | — | — | — | 0.01 | 0.02 | 0.04 | 0.06 | 0.08 | 0.08 | 0.08 |
| | A4 | | — | — | 0.005 | 0.03 | — | — | — | — | — | — | — | — |
| | A5 | | — | — | — | — | 0.04 | — | — | — | — | — | — | — |
| Non-ionic polymer | P1 | | — | 0.5 | — | — | 0.5 | 0.5 | — | — | — | — | — | — |
| | P2 | | — | — | — | — | 0.01 | — | — | — | — | — | — | — |
| Base | B1 | | 0.05 | 0.05 | 0.05 | 0.05 | 0.05 | 0.05 | 0.05 | 0.05 | 0.05 | 0.05 | 0.05 | 0.05 |
| Others | X1 | | — | — | — | — | — | — | — | — | — | — | 0.5 | — |
| | X2 | | — | — | — | — | — | — | — | — | — | — | — | 0.5 |
| pH | | — | 5.2 | 5.2 | 5.0 | 4.0 | 3.8 | 4.7 | 4.4 | 4.2 | 4.0 | 3.8 | 3.8 | 3.8 |
| Polishing rate | Silicon oxide (RO) | nm/min | 100 | 130 | 0 | 0 | 1 | 130 | 67 | 60 | 56 | 55 | 40 | 46 |
| | Silicon nitride (RN) | | 30 | 30 | 40 | 0 | 1 | 36 | 40 | 57 | 54 | 68 | 75 | 70 |
| Polishing rate ratio | RO/RN | — | 3.3 | 4.3 | 0 | — | 1 | 3.6 | 1.7 | 1.1 | 1.0 | 0.8 | 0.5 | 0.7 |

In Examples, it was confirmed that the polishing rate ratio (RO/RN) of the polishing rate RO of silicon oxide to the polishing rate RN of silicon nitride is 30 or more, and excellent polishing selectivity of silicon oxide with respect to silicon nitride is obtained.

The invention claimed is:

1. A polishing liquid comprising: abrasive grains containing a hydroxide of a tetravalent metal element; a monovalent acid component having no carboxy group;

and a non-ionic polymer, wherein a mass ratio of a content of the acid component to a content of the hydroxide of the tetravalent metal element is 0.3 or more and 5 or less, the non-ionic polymer contains a glycerin-based polymer and a polyoxyalkylene compound other than a glycerin-based polymer, a mass ratio of a content of the glycerin-based polymer to a content of the polyoxyalkylene compound other than a glycerin-based polymer is 10 or more and 100 or less, and a pH is 4.5 or less.

2. The polishing liquid according to claim 1, wherein a pKa of the acid component is 4.50 or less.

3. The polishing liquid according to claim 1, wherein the acid component contains a sulfonic acid compound.

4. The polishing liquid according to claim 1, further comprising a base component.

5. The polishing liquid according to claim 4, wherein the base component contains a pyrazole compound.

6. The polishing liquid according to claim 1, wherein the abrasive grains contain cerium hydroxide.

7. The polishing liquid according to claim 1, wherein the pH is 3.5 or more.

8. The polishing liquid according to claim 1, wherein the polishing liquid is used in polishing of a surface to be polished containing silicon oxide and silicon nitride.

9. A polishing method comprising a step of polishing a surface to be polished by using the polishing liquid according to claim 1.

10. The polishing method according to claim 9, wherein the surface to be polished contains silicon oxide and silicon nitride.

11. The polishing liquid according to claim 1, wherein the acid component contains an aminosulfonic acid compound.

12. The polishing liquid according to claim 11, wherein the aminosulfonic acid compound contains at least one selected from the group consisting of aromatic aminosulfonic acid, aliphatic aminosulfonic acid, sulfamic acid, and salts of these.

13. The polishing liquid according to claim 1, wherein the acid component contains at least one selected from the group consisting of sulfanilic acid, metanilic acid, sulfamic acid, and salts of these.

14. The polishing liquid according to claim 1, wherein the content of the acid component is 0.001 to 1% by mass on the basis of the total mass of the polishing liquid.

15. The polishing liquid according to claim 1, comprising no acid component containing a carboxy group.

16. The polishing liquid according to claim 4, wherein the base component contains a heterocyclic amine.

17. The polishing liquid according to claim 1, wherein the pH is 3.8 or less.

* * * * *